(12) United States Patent
Kozicki et al.

(10) Patent No.: US 7,402,847 B2
(45) Date of Patent: Jul. 22, 2008

(54) PROGRAMMABLE LOGIC CIRCUIT AND METHOD OF USING SAME

(75) Inventors: Michael N Kozicki, Phoenix, AZ (US); Maria Mitkova, Mesa, AZ (US); Chakravarthy Gopalan, Santa Clara, CA (US); Muralikrishnan Balakrishnan, Tempe, AZ (US)

(73) Assignee: Axon Technologies Corporation, Scottsdale, AZ (US)

( * ) Notice: Subject to any disclaimer, the term of this patent is extended or adjusted under 35 U.S.C. 154(b) by 163 days.

(21) Appl. No.: 11/404,160

(22) Filed: Apr. 13, 2006

(65) Prior Publication Data

US 2006/0279328 A1 Dec. 14, 2006

Related U.S. Application Data

(60) Provisional application No. 60/670,845, filed on Apr. 13, 2005.

(51) Int. Cl.
*H01L 27/10* (2006.01)

(52) U.S. Cl. .............................. 257/202; 257/E27.108; 257/204; 257/208; 257/5; 716/16; 716/17
(58) Field of Classification Search ................ 257/202, 257/E27.108
See application file for complete search history.

(56) References Cited

U.S. PATENT DOCUMENTS

| | | | |
|---|---|---|---|
| 5,761,115 A * | 6/1998 | Kozicki et al. | 365/182 |
| 2005/0174861 A1 * | 8/2005 | Kim et al. | 365/200 |
| 2006/0097342 A1 * | 5/2006 | Parkinson | 257/528 |
| 2006/0131556 A1 * | 6/2006 | Liu et al. | 257/5 |

* cited by examiner

*Primary Examiner*—Tu-Tu V Ho
(74) *Attorney, Agent, or Firm*—Shell & Wilmer L.L.P.

(57) ABSTRACT

A programmable logic circuit, including programmable memory element, suitable for microprocessor applications, and a method of using the circuit are disclosed. The programmable circuit includes at least one logic cell, columns and rows of wires coupled to the logic cell, and a programmable memory element located at the intersection of two wires. The programmable element acts as a switch and as memory for the logic circuit.

20 Claims, 8 Drawing Sheets

PROGRAMMABLE LOGIC CIRCUIT AND METHOD OF USING SAME

CROSS REFERENCE TO RELATED APPLICATIONS

This application claims the benefit of U.S. patent application Ser. No. 60/670,845, entitled USE OF PROGRAMMABLE CELL DEVICES IN RECONFIGURABLE LOGIC APPLICATIONS, filed Apr. 13, 2005, the contents of which are incorporated herein by reference.

FIELD OF INVENTION

The present invention generally relates to program logic circuits and systems, and more particularly, to programmable logic circuits including programmable switch and programmable memory elements.

BACKGROUND OF THE INVENTION

Microprocessors have long been used in a wide variety of applications, such as computers, automobiles, appliances, and hand-help devices such as cameras, personal digital assistants (PDAs) and cell phones. Often times, the same microprocessor type is used for several such applications by using software that is specific for the application. Because the microprocessors are typically designed to be used for a variety of applications, the architecture of the microprocessor cannot generally be optimized for any one application. Thus, the typical microprocessor is relatively inefficient for a specific application, compared to a microprocessor designed for that specific application.

Microprocessors or logic devices can be designed for specific or semi-specific applications. In this case, custom or semi-custom logic functions can be implemented in the hardware itself, rather than in corresponding software, making these devices more efficient. Such circuits also typically require fewer transistors to perform their intended function, compared to traditional microprocessors, and thus power consumption of these processors is typically less compared to typical microprocessors. Reduced power consumption is particularly desirable in hand-held or portable devices, where stored energy or power is at a premium.

Although custom or semi-custom processors can perform their intended functions faster and with less power, compared to traditional microprocessors, the custom processors are generally expensive to design and manufacture and require additional design time. Thus, these processors are typically only used where large volumes of the same processor are required, such that the increased cost of the microprocessor can be recouped.

Furthermore, because the custom processors are designed for a particular application, various appliances, such as PDAs, cell phones, cameras, and the like would require multiple application-specific processors to perform their multiple functions. Use of multiple processors in a single appliance results in reduced power efficiency. Thus, many of the benefits associated with custom microprocessors may be lost in applications where more than one microprocessor is required.

Recently, programmable logic devices (PLDs) have been developed to overcome the shortcomings of both traditional and application-specific microprocessors. PLDs are designed to reconfigure themselves, as needed, for specific applications.

PLDs generally include a configurable logic portion and a personalization memory portion. Information is stored in the memory portion and is used to set the configuration of the logic portion.

One form of PLD is a field programmable gate array (FPGA) device.

Suppliers of PLDs often provide libraries of pre-defined logic functions for the PLD, such that a customer can configure the PLD for a specific application by loading the configuration data into the memory of the microprocessor. Thus the set-up time and manufacturing time for these PLD devices are shorter that for application-specific microprocessors. However, the use of the memory-controlled connecting components for the circuit routing makes FPGAs considerably slower than application-specific circuits, for the same applications. Furthermore, most of the circuit area of a FPGA is devoted to the control gates compared to the logic circuitry. In addition, typical FPGAs are essentially one-time programmable, so multiple chips are required to perform multiple functions. Accordingly, microprocessors with reprogrammable personalization memory are desired.

FIG. 1 illustrates a reconfigurable logic circuit 100, which uses electrochemical nanobridge technology to reconfigure PLD devices. Circuit 100 includes a plurality of logic cells 102 coupled together by rows 104 and columns 106 of wiring in a two-dimensional, crossbar matrix 106. Transistors are located at the intersection of the lines and columns, and each transistor is controlled by a static random access memory (SRAM) device 108. The area at each intersection is therefore defined by the area of the SRAM device, which is relatively large-typically $120F^2$, where F is the minimum feature size in the SRAM device.

Accordingly, improved programmable logic devices, with reduced area devoted to control gates, and which are relatively fast, are desired.

SUMMARY OF THE INVENTION

The present invention provides programmable logic devices that are relatively fast and that have relatively little area devoted to the control gates and memory. Such devices can be used to replace both traditional and application-specific microprocessors in a variety of applications and can be used in systems such as computers, automobiles, appliances, cameras, personal digital assistants, cell phones, and the like.

The ways in which the present invention addresses various drawbacks of now-known devices and systems are discussed in greater detail below. However, in general, the present invention provides reconfigurable programmable logic devices, which include a programmable element that functions as both memory and a switch.

In accordance with various embodiments of the invention, a programmable logic circuit or device includes configurable logic, wiring coupled to the configurable logic, and a programmable memory element coupled to the wiring. The programmable memory element can function a switch to couple the wiring and/or as reconfigurable memory. In accordance with various aspects of the invention, the programmable memory element includes an ion conductor and at least two electrodes. When a bias is applied across two electrodes, the resistance of the element changes. The resistance change can be measured, and thus the element can function as both a switch and a memory element.

In accordance with one embodiment of the invention, a programmable logic circuit includes a programmable memory element that includes an ion conductor formed of a high bandgap material. Exemplary high bandgap materials include germanium rich germanium sulfide glasses doped with silver.

In accordance with another embodiment, the memory element has a relatively high threshold voltage (greater than about 0.5 V).

In accordance with yet another embodiment of the invention, the memory element has a relatively high "off" resistance (greater than about one GΩ).

In accordance with another embodiment of the invention, a programmable logic circuit includes a first wire, a first driver coupled to the first wire, a programmable memory element coupled to the first wire, and a second wire, a second driver coupled to the second wire, and an inverter coupled to the driver, wherein the second wire is also coupled to the programmable memory element. In accordance with various aspects of this embodiment, the circuit further includes a first transistor coupled between the first driver and the programmable memory element and a second transistor coupled between the second driver and the programmable memory element.

In accordance with yet another embodiment of the invention, a programmable logic circuit includes a programmable memory element including a first electrode, a first ion conductor, a second electrode, a second ion conductor, and a third electrode. In accordance with various aspects of this embodiment, one of the electrodes is common to two of the ion conductors.

In accordance with yet another embodiment of the invention, a programmable logic circuit includes a first wire, a first driver coupled to the first wire, a programmable memory element coupled to the first wire; a second wire coupled to the programmable element, a second driver coupled to the second wire; and a third wire coupled to the programmable element, a third driver coupled to the third wire, and an inverter coupled to the driver. In accordance with various aspects of this embodiment, the circuit further includes a first transistor coupled between the first driver and the programmable memory element, a second transistor coupled between the second driver and the programmable memory element, and a third transistor coupled between the third driver and the programmable memory element.

BRIEF DESCRIPTION OF THE DRAWING FIGURES

A more complete understanding of the present invention may be derived by referring to the detailed description and claims, considered in connection with the figures, wherein like reference numbers refer to similar elements throughout the figures, and:

Skilled artisans will appreciate that elements in the figures are illustrated for simplicity and clarity and have not necessarily been drawn to scale. The dimensions of some of the elements in the figures may be exaggerated relative to other elements to help to improve understanding of embodiments of the present invention.

DETAILED DESCRIPTION

The present invention generally relates to programmable logic circuits. More particularly, the invention relates to circuits including reconfigurable memory elements. The elements and circuits of the present invention can be used in a variety of applications and can replace traditional and application-specific processors in a variety of systems.

Figure 1:
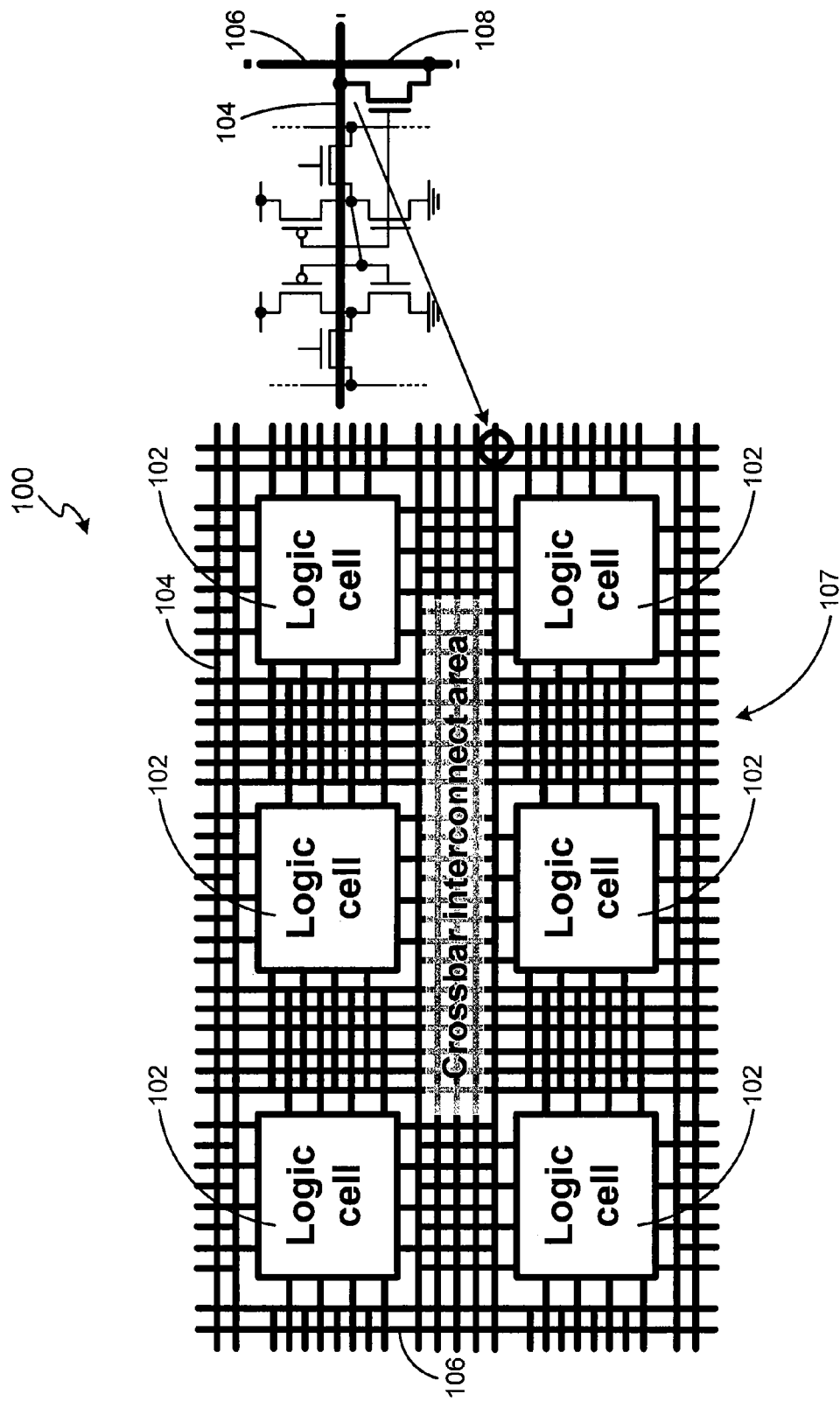
FIGS. 1 illustrates a programmable logic circuit known in the art.
Figure 2:
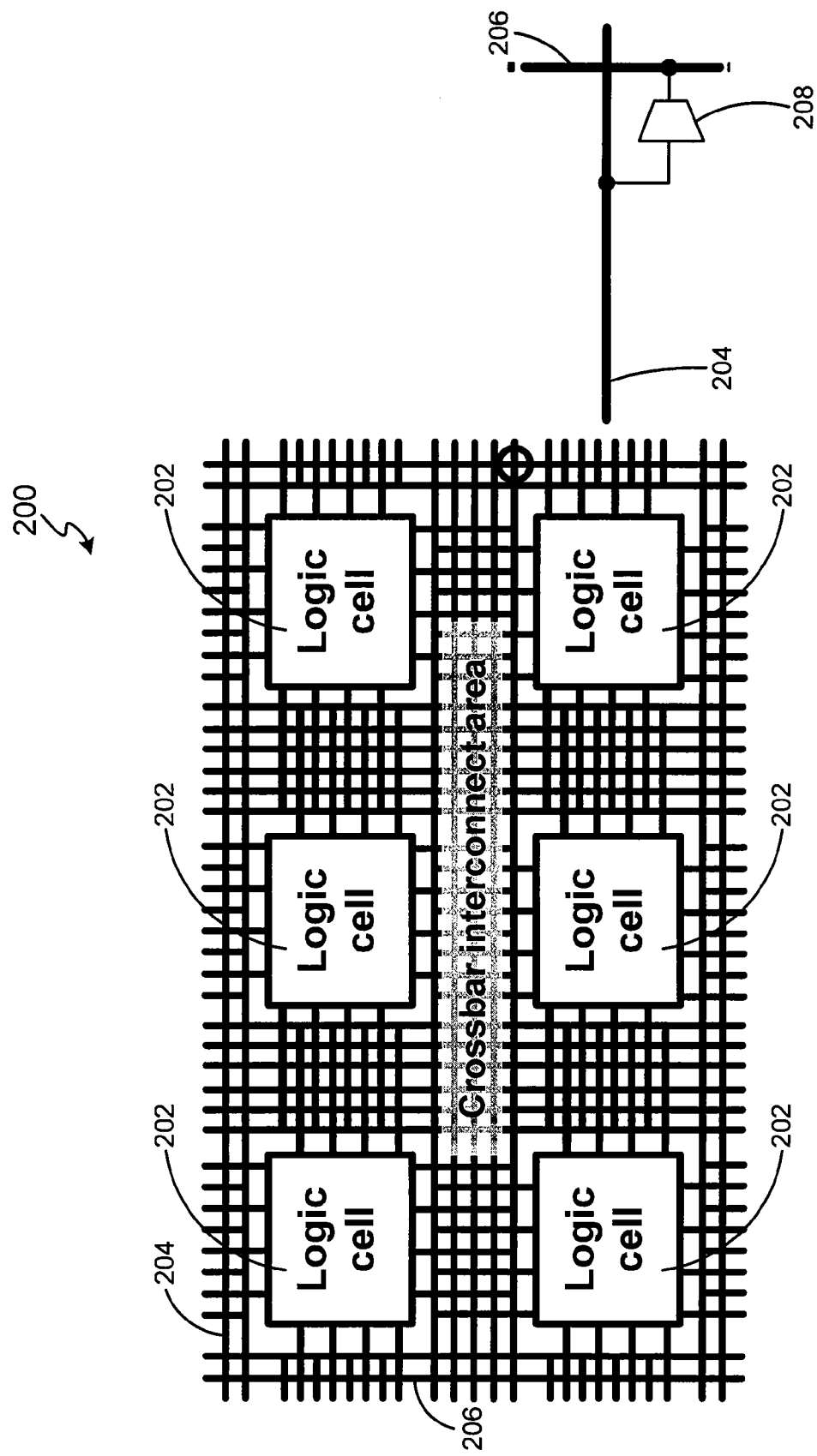
FIG. 2 illustrates a programmable logic circuit in accordance with various embodiments of the invention.

FIG. 2 illustrates a portion of a programmable logic circuit 200 in accordance with exemplary embodiments of the present invention. Circuit 200 includes a plurality of logic cells 202 coupled together with electrical wires configured in rows 204 and columns 206, and programmable elements 208. Cells 202 and wires 204, 206 may include any circuits and wires known in the art, such as those used in circuit 100.

Programmable elements 208 are inserted at the intersection of various row and columns to allow reconfiguration of circuit 200. Programmable element 208 may act as both a switch, to couple or decouple various rows and columns of wires, and as memory for storing information in circuit 200. Thus, the space required for memory elements and switches of circuit 200 is significantly reduced, which in turn reduces the materials and manufacturing costs associated with circuit 200.

Figure 3:
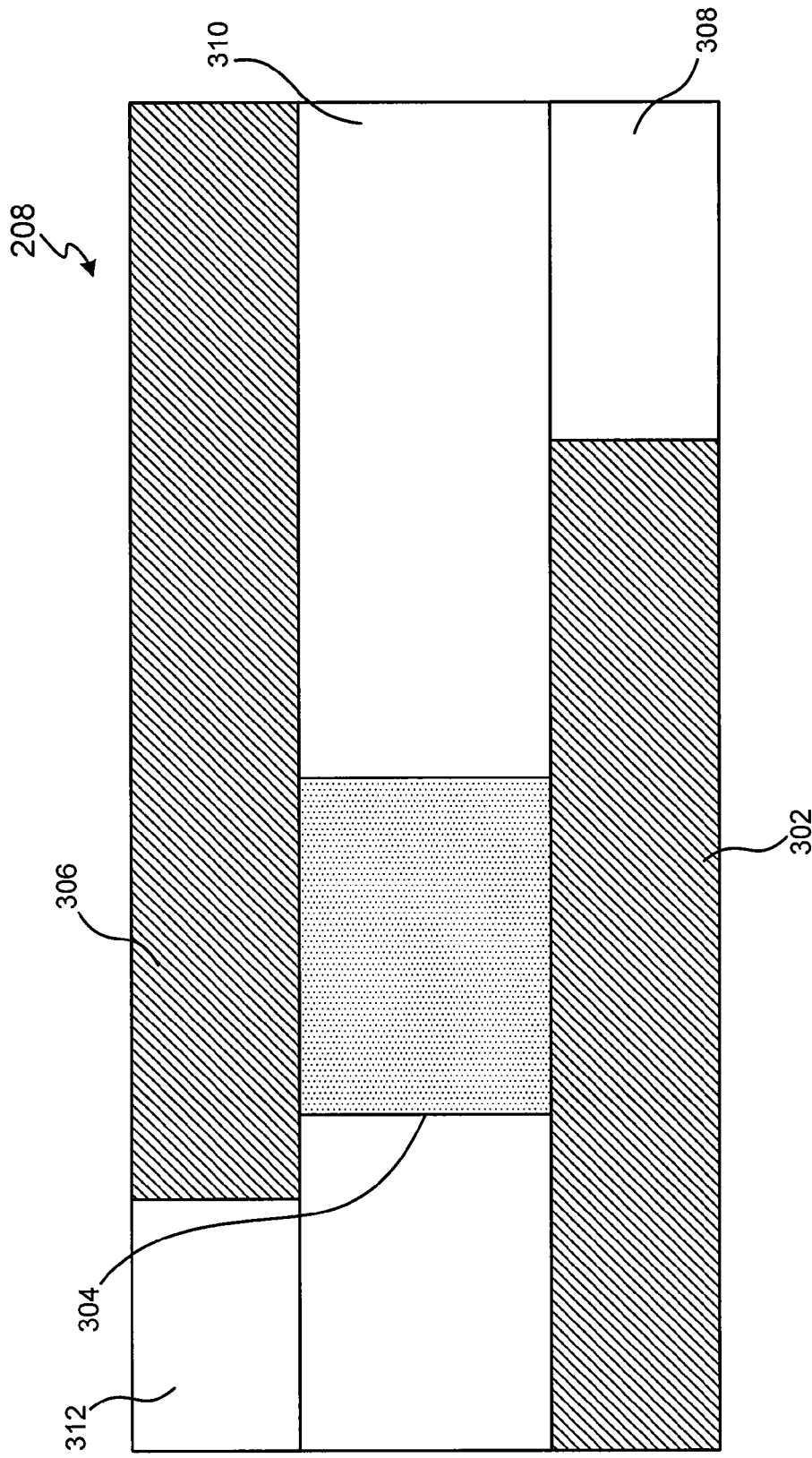
FIG. 3 illustrates a programmable memory element in accordance with various embodiments of the invention.

FIG. 3 illustrates a programmable memory element 208 in greater detail. Element 208 includes a first electrode 302, an ion conductor 304, a second electrode 306, and insulating structures 308, 310, and 312 to respectively isolate the first electrode 302, the ion conductor 304, and the second electrode 306.

Generally, element 208 is configured such that when a bias greater than a threshold voltage ($V_T$) is applied across electrodes 302, 306, the resistance of the cell changes. When a bias $V \geq V_T$ is applied across electrodes 302, 306, conductive ions within the ion conductor begin to migrate and form a region having an increased conductivity compared to the bulk ion conductor (an electrodeposit or conductive region) at or near the more negative of the electrodes. The amount of conductive material deposited depends on the magnitude and duration of the ion current, i.e., the total Faradic charge. The electrodeposit is electrically neutral and is stable in that it generally does not spontaneously dissolve. As the conductive region forms, the resistance between the electrodes decreases.

In the absence of any barriers, which are discussed in more detail below, the threshold voltage required to grow the conductive region between the electrodes, and thereby significantly reduce the resistance of the element, is approximately a few hundred millivolts. If the same voltage is applied in reverse, the conductive region dissolves back into the ion conductor and the element returns to a high resistance state.

In accordance with various embodiments of the invention, programmable element 208 is formed overlying a wiring schedule of a programmable logic device. In this case, an amount of substrate space required to form the circuit is reduced.

Referring again to FIG. 3, first electrode 302 may be formed of any suitable conductive material. For example, electrode 302 may be formed of doped polysilicon material or metal.

The configuration of first electrode may also vary according to application. For example, first electrode 302 may common to multiple elements. In accordance with other embodiments, first electrode 302 is not common to multiple elements. A more detailed discussion of common electrode configurations is described in U.S. Pat. No. 6,998,312, issued to Kozicki et al. on Feb. 14, 2006, the contents of which are hereby incorporated herein by reference.

In accordance with various exemplary embodiments of the invention, one of electrode 302, 306 is formed of a conductive material that dissolves in ion conductor 304 when a sufficient bias ($V \geqq V_T$) is applied across the electrodes (an oxidizable or soluble electrode) and the other electrode is relatively inert and does not dissolve during operation of the programmable element (an indifferent or inert electrode). For example, electrode 302 may be an anode during a write process and be comprised of a material including silver that dissolves in the ion conductor and electrode 306 may be a cathode during the write process and be comprised of an inert material such as tungsten, nickel, molybdenum, platinum, metal silicides, conducting oxides, nitrides, and the like.

Having at least one electrode formed of a material including a material that dissolves in the ion conductor facilitates maintaining a desired dissolved material concentration within ion the conductor, which in turn facilitates rapid and stable conductive region formation within the ion conductor. Furthermore, use of an inert material for the other electrode (cathode during a write operation) facilitates electrodissolution of any conductive region that may have formed and/or return of the programmable element to an erased or open state after application of a sufficient voltage.

As noted above, programmable structures of the present invention may include one or more barrier or buffer layers interposed between at least a portion of the ion conductor and at least one of the electrodes. Exemplary materials suitable for buffer and barrier layers are set for in U.S. Pat. No. 6,865,117, issued to Kozicki et al. on Mar. 8, 2005, the contents of which are incorporated herein by reference.

Ion conductor 304 is formed of material that conducts ions upon application of a sufficient voltage. Element 208 and, in particular, ion conductor 304 material, are preferably relatively immune to noise and voltage fluctuations. Relative immunity can be achieved by forming ion conductor 304 of a material with a relatively high threshold voltage. In addition, to reduce any leakage in a circuit, the ion conductor 304 preferably has a relatively high off resistance (e.g., greater than 1 GΩ). Furthermore, because element 208 is used to electrically coupled wires, the on resistance is preferably relatively low (e.g., less that a few kΩ, and preferably less than 1 kΩ)

Suitable ion conductor materials include polymeric materials, glasses and semiconductor materials. In general, ion conductor material in accordance with the present invention can conduct ions without requiring a phase change, can conduct ions at a relatively low temperature (e.g., below 125° C.), can conduct ions at relatively low electrical currents, have a relatively high transport number, and exhibit relatively high ion conductivity. Exemplary ion conductor material includes chalcogenide material (e.g., $AS_xS_{1-x}$, $As_xSe_{1-x}$, $As_xTe_{1-x}$, $Ge_xSe_{1-x}$, $Ge_xS_{1-x}$, $Ge_xTe_{1-x}$, and $MO_x$, where M is a transition metal). However, other materials may be used as an ion conductor in accordance with various embodiments of the invention. For example, polymeric ion conductors such as poly(ethylene oxide) may be used in accordance with the present invention.

The ion conductor material may also suitably include dissolved conductive material. For example, the ion conductor may comprise a solid solution that includes dissolved metals and/or metal ions. In accordance with one exemplary embodiment of the invention, the ion conductor material includes metal and/or metal ions dissolved in chalcogenide glass. An exemplary chalcogenide glass with dissolved metal in accordance with the present invention includes a solid solution of $As_xS_{1-x}$—Ag, $As_xSe_{1-x}$—Ag, $As_xTe_{1-x}$—Ag, $Ge_xSe_{1-x}$—Ag, $Ge_xS_{1-x}$—Ag, $Ge_xTe_{1-x}$—Ag, $As_xS_{1-x}$—Cu, $As_xSe_{1-x}$—Cu, $As_xTe_{1-x}$—Cu, $Ge_xSe_{1-x}$—Cu, $Ge_xS_{1-x}$—Cu, and $Ge_xTe_{1-x}$—Cu, where x ranges from about 0.1 to about 0.5, $MO_x$—Ag, $MO_x$—Cu, where M is a transition metal and x is 1, 2, or 3, other chalcogenide materials including silver, copper, combinations of these materials, and the like.

By way of particular example, an ion conductor comprising a germanium-rich germanium sulfide glass ($Ge_xS_{1-x}$, where x is greater than about 0.3 and preferably about 0.4) doped with silver (about 20 to 30 atomic percent and preferably about 25 atomic percent) has a relatively high bandgap, which results in element 208 having a relatively high threshold voltage (e.g., greater than about 0.5 V), a high off resistance (e.g., greater than about 1 GΩ), which is capable of withstanding high write currents (e.g., about 1 mA) required to produce a low on sate resistance.

Insulating structures 308, 310 and layer 312 are formed of material that prevents or mitigates undesired diffusion of electrons and/or ions across portions of a element 208 and/or between elements. In accordance with one embodiment of the invention, the insulating material includes silicon oxide, silicon nitride, silicon oxynitride, polycrystalline silicon, amorphous silicon, amorphous carbon, polymeric materials such as polyimide or parylene, or any combination thereof.

Figure 4:
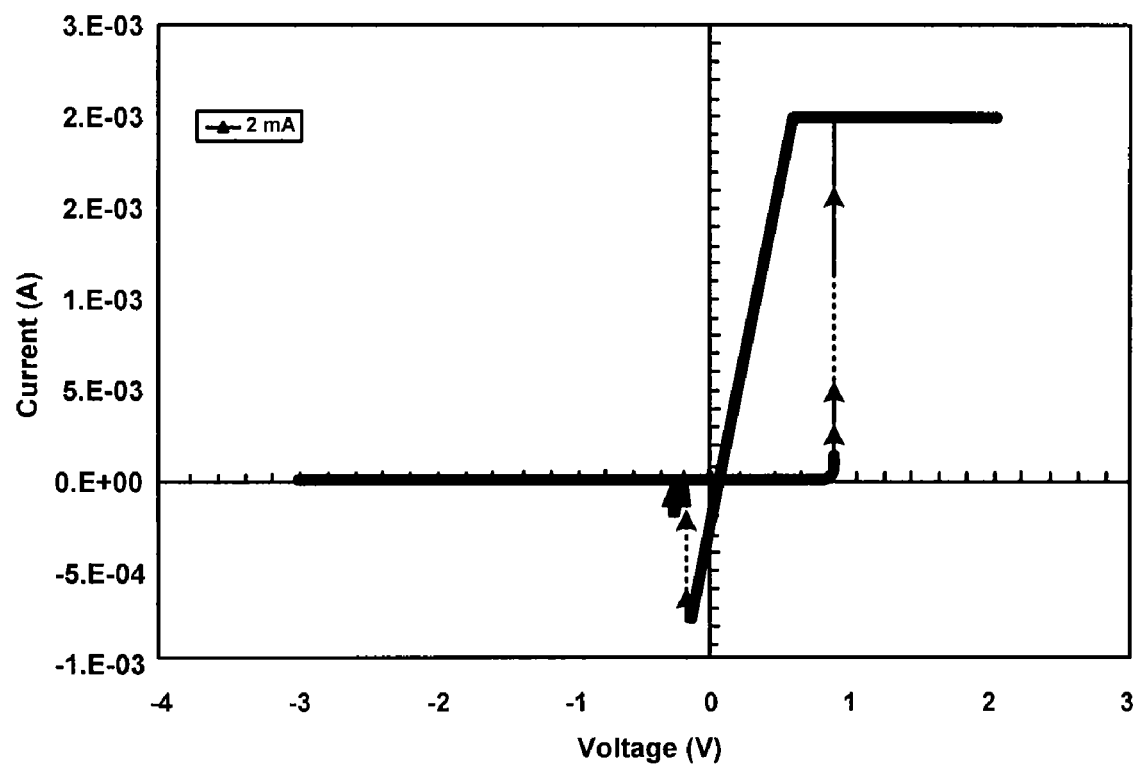
FIG. 4 illustrates a current-voltage plot of a programmable memory element in accordance with various embodiments of the invention.
Figure 5:
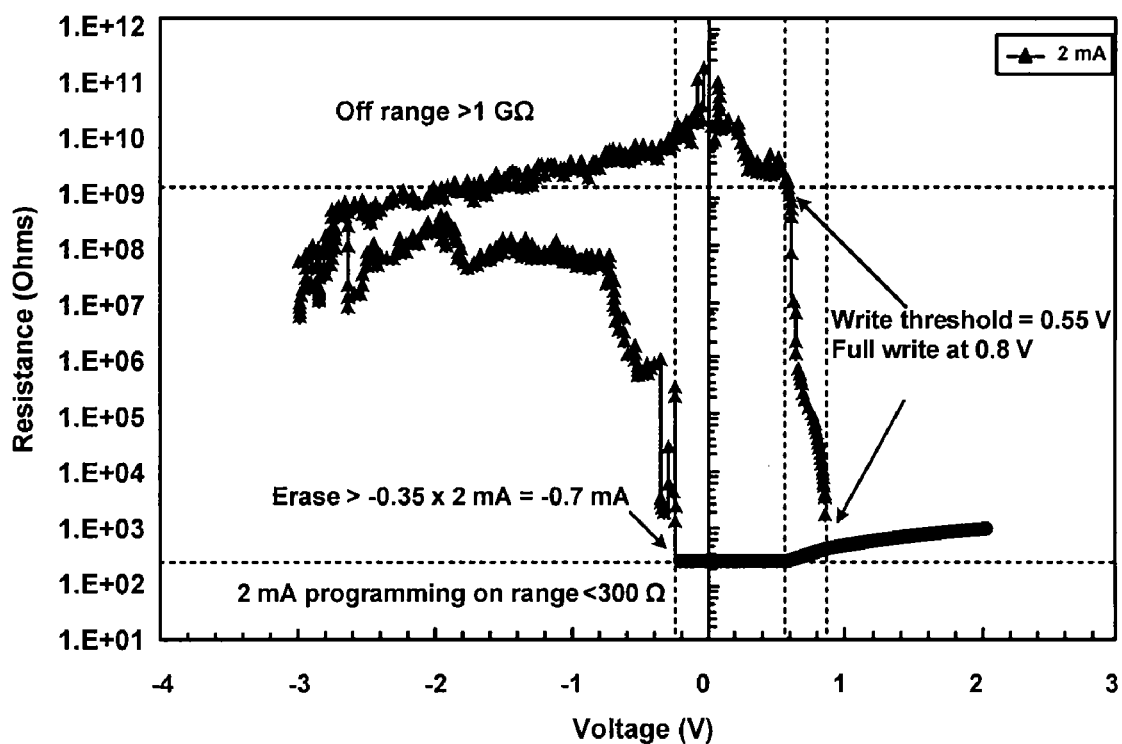
FIG. 5 illustrates a resistance-voltage plot of a programmable memory element in accordance with various embodiments of the invention.

FIG. 4 illustrates a current-voltage plot and FIG. 5 illustrates a resistance-voltage plot of a programmable element having a $Ge_{0.4}S_{0.6}$ ion conductor with a diameter of about 300 nm and a thickness of about 100 nm between a silver first electrode and a tungsten second electrode. As illustrated, a write current of about 2 mA reduced the resistance of the element from over 1 GΩ to less than about 300 Ω, with the write transition occurring at about 0.55V. For this particular element, the erase transition initiates at over about 35% of the write current (>than about −0.7 mA).

The element represented by FIGS. 4 and 5 has a very stable low-resistance on state, capable of withstanding +/−0.7 mA for a 2 mA write current. The high current failure mechanism for the illustrated element is thought to be electromigration related; for example, 14 hours at constant negative bias driving several hundred μA may cause the resistance to rise by as much as a factor of 10. However, the damage to the connection can be reversed or healed by applying a single positive pulse above 0.55 V across the device. In addition to having good off resistance, on resistance, and threshold voltage characteristics, the activation energy associated with these device parameters is small, which means that their values vary little with temperature. This, in turn, leads to a wide operating temperature window for element 208 (up to 150° C.) for devices based on this material system.

Figure 6:
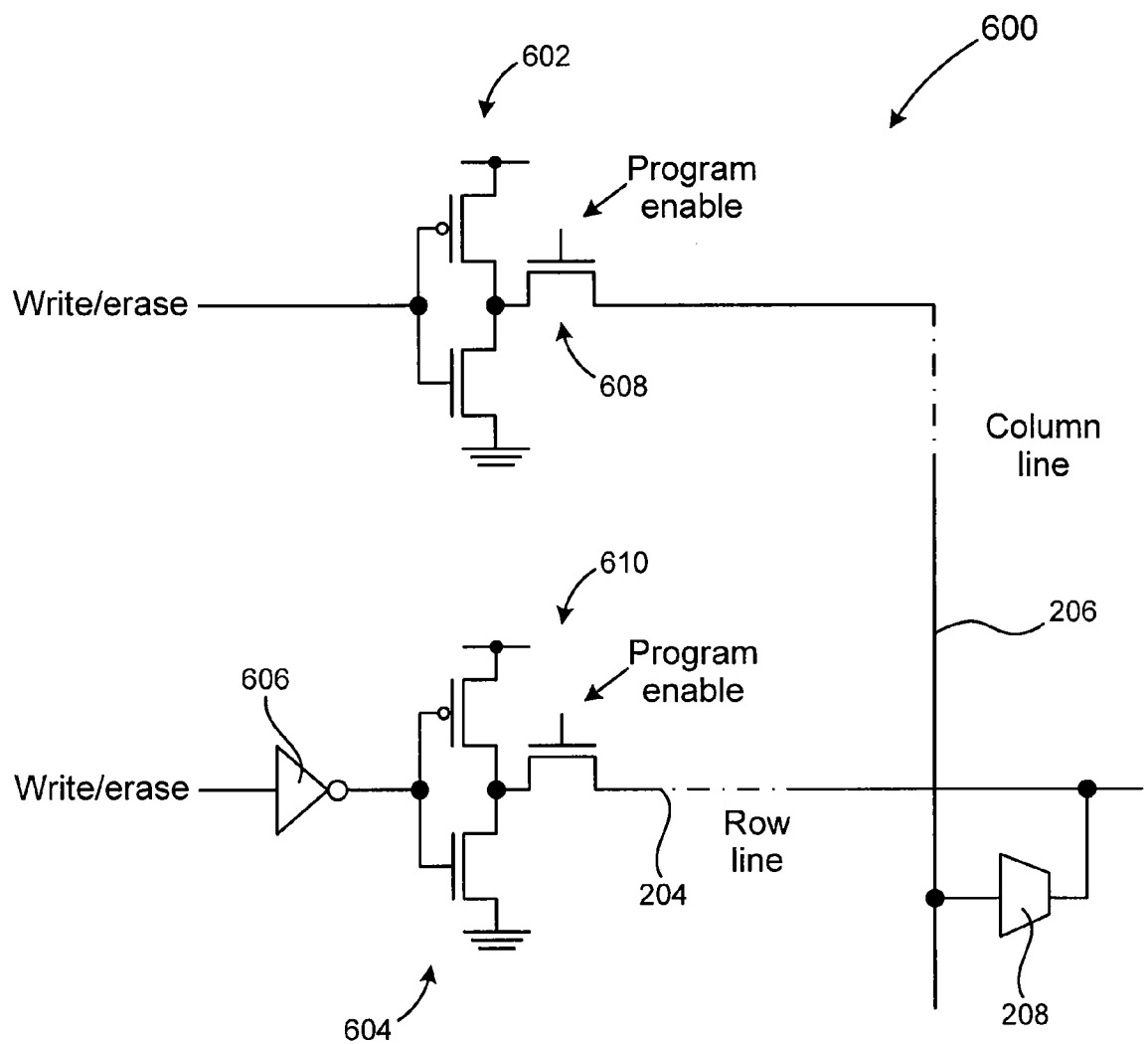
FIG. 6 illustrates a portion of a programmable logic circuit in accordance with one embodiment of the invention.
Figure 7:
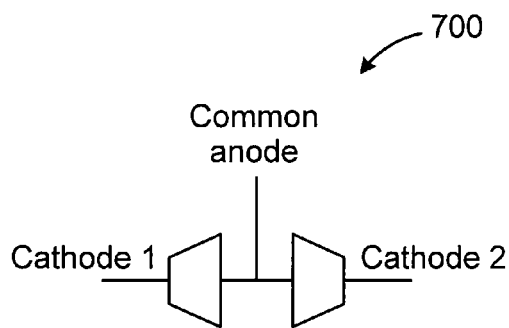
FIG. 7 is a schematic representation of a programmable memory element having a common electrode.
Figure 9:
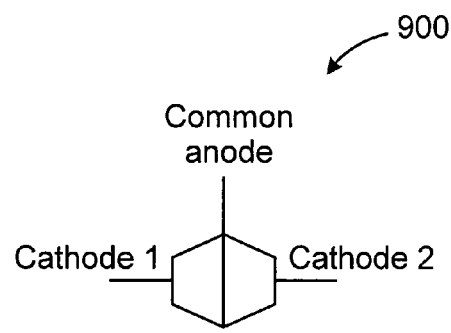
FIG. 9 is a schematic representation of a programmable memory element having a common electrode in accordance with another embodiment of the invention.

FIG. 6 illustrates a portion 600 of circuit 200 in greater detail. Portion 600 includes drivers 602, 604, which are respectively coupled to column line 206 and row line 204 that intersect at programmable element 208. Element 208 is configured to couple column line 206 and row line 204 when the element is programmed in its low resistance state. Portion 600 also includes an inverter 606, to invert an input signal to one of the drivers, and transistors 606, 608 (e.g., MOS pass transistors). Transistors 608, 610 are sized to source and sink the programming current pulses required to place element 208 in a low resistance state. In accordance with alternative embodiments of the invention, transistors 608, 610 may suitably be replaced with tri-state buffers.

In the illustrated embodiment, column line 206 is set low to write element 208 and line 206 is set high to erase element 208. The inverted sign is supplied to corresponding row line 204, thus creating a bias across element 208. The program enable is then set high on the selected row and column to apply the write or erase signal to the programmable element for the appropriate amount of time (e.g., about 100 nsec). Once the element is programmed, the program enable is set low, so that the row and column lines are "floating" and can be used to interconnect logic cells 202.

FIGS. 7-10 illustrate additional programmable elements 700 and 900, which can be used in programmable logic circuits described herein. Elements 700 and 900 are similar to element 208, except elements 700 and 900 include an additional ion conductor and an additional electrode. Structures 700 and 900 generally have higher threshold voltages (about double for the same feature sizes) compared to element 208, which increases the noise immunity of the element.

Programmable element 700 includes a first electrode 802, a second electrode 804, first and second ion conductors 806, 808, a third electrode in contact with the first and second ion conductors, a contact 812, and insulating layers 814, 816. In accordance with on aspect of this embodiment, common (third) electrode 810 includes material soluble in the ion conductor and first and second electrodes 802, 804 include inert electrode material. In accordance with an alternative embodiment, electrodes 802, 804 are formed of soluble electrode material and electrode 810 is formed of inert electrode material. Third electrode 810 can be used as a control terminal, as described below.

Figure 8:
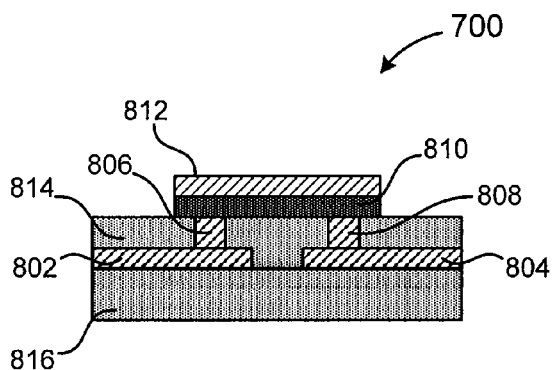
FIG. 8 illustrates a common electrode configuration of a programmable memory element in accordance with one embodiment of the invention.
Figure 10:
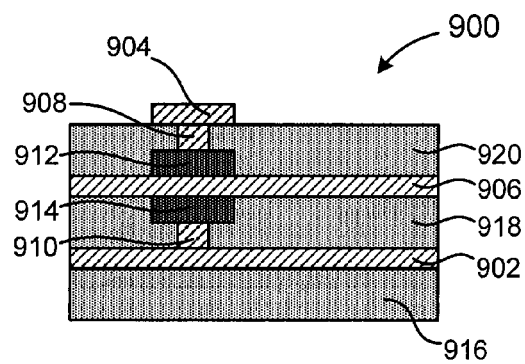
FIG. 10 illustrates a common electrode configuration of a programmable memory element in accordance with another embodiment of the invention.

As illustrated in FIG. 8, electrodes 802 and 804 are substantially coplanar and isolated from electrode 810 via insulating layer 814, which may include any of the insulating materials described above in connection with element 208.

Programmable element 900 is similar to element 700, except element 900 is formed in a vertical configuration. Element 900 requires less space than element 700; however, element 700 may be less expensive to manufacture using a back-end-of-line (BEOL) process.

Similar to element 700, element 900 includes a first electrode 902, a second electrode 904, a common third electrode 906, first and second ion conductors 908, 910 and insulating structures 916, 918, and 920, which may comprise any insulating materials described herein. In the illustrated example, common electrode 906 is includes portions 912, 914 that include material that dissolves in ion conductors 908, 910. In accordance with an alternative embodiment of the invention, third electrode 906 comprises inert material and electrodes 902, 904 comprise material soluble in ion conductors 908, 910.

For the illustrated common electrode configuration, when the anode is left to float, the voltage between the two cathodes can reach twice the write threshold of an individual device element before any switching occurs; i.e., the voltage drop across the pair is dropped equally across each element and since neither will switch until the write threshold is reached, both devices remain off until the cathode-to-cathode voltage exceeds 2× the write threshold. Note that when this happens, only the device that is in forward bias can switch and the reverse bias device will remain off and will therefore significantly limit the write current, so that a low resistance state will not be achieved. To switch the three-terminal element to its low resistance state, the common anode is set high and the cathodes are pulled low (preferably in sequence to reduce current drain and ensure each device switches to the desired resistance). Once programmed, the anode is allowed to float and the cathodes are effectively connected together. To erase, the anode is pulled low and the cathodes pulled high to erase each device.

Figure 11:
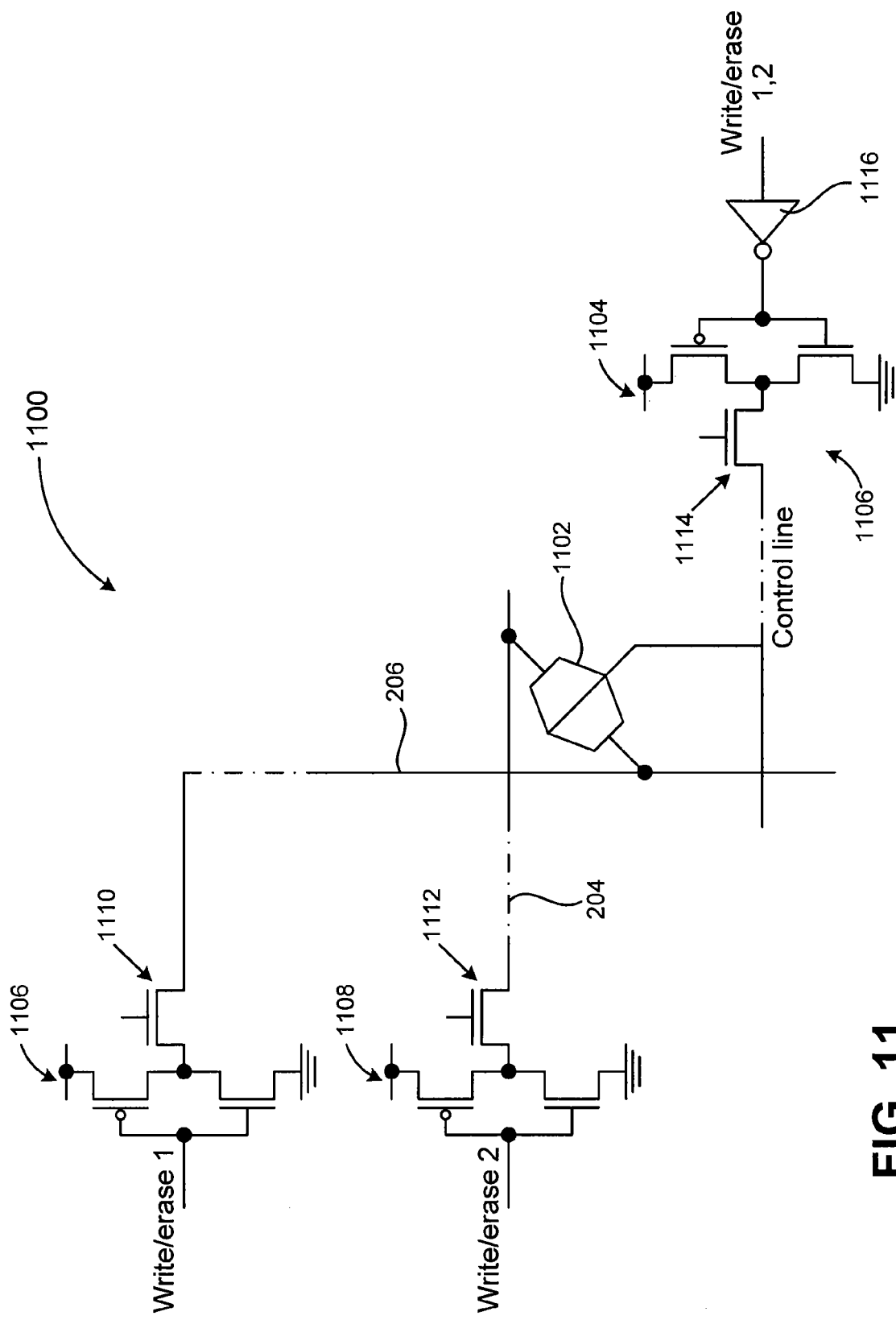
FIG. 11 illustrates a programmable logic circuit having a programmable memory element with a common electrode in accordance with various embodiments of the invention.

FIG. 11 illustrates a circuit portion 1100 suitable for use in circuit 200. Portion 1100 is similar to potion 600, except portion 1100 includes a three-terminal programmable element 1102 (e.g., element 700 or 900) rather than element 208, and portion 1100 includes an additional driver 1104 and transistor 1106.

Portion 1100 includes drivers 1106, 1108, respectively coupled to column line 206 and row line 204, pass transistors 1110, 1112, 1114, and inverter 1116. Element 1104 is written by enabling a low (write/erase =high) on both the selected column and row, preferably in sequence, the inverse appearing on the control line. The device is erased by enabling a high on both the selected row and column low (write/erase =low) with the inverse signal on the control line.

The circuits illustrated in FIGS. 2, 6, and 11 are advantageous over typical programmable logic circuits because the illustrated circuits may not require additional transistors or diodes used in typical memory arrays for isolation between near-by columns and rows. In the illustrated embodiments, column-to-column or row-to-row connections are not permitted in the same rows and columns and it is therefore possible to operate a switching matrix without isolation. However, in the case where full isolation is required, three terminal devices 700, 900 can be used with a modification to the scheme shown in FIG. 11. In this case, individual elements are selected using dedicated control lines to each device, each with their own pass transistor, adding one transistor for each switching location.

Although the present invention is set forth herein in the context of the appended drawing figures, it should be appreciated that the invention is not limited to the specific form shown. For example, although the systems are illustrated with MOS-based transistors, alternative transistors are suitable for use with the present invention. Further, although the circuits are described as including a programmable element at the intersection of a row and a column of wires, the invention is not so limited. The programmable elements described herein can be used to couple any wires in the circuit. Various other modifications, variations, and enhancements in the design and arrangement of the method and apparatus set forth herein, may be made without departing from the spirit and scope of the present invention as set forth in the appended claims.

We claim:

1. A circuit comprising:
   a logic cell;
   a first wire coupled to the logic cell;
   a second wire coupled to the logic cell; and
   a programmable memory element coupled to the first wire and second wire, wherein the programmable element serves as both a switch and a configurable memory element, and wherein the programmable memory element comprises a first electrode, a first ion conductor, and a second electrode, and wherein when a bias greater than a threshold voltage of the programmable memory element is applied across the first electrode and the second electrode, conductive ions within the first ion conductor migrate and form a region having increased conductivity compared to a remaining portion of the first ion conductor.

2. The circuit of claim 1, wherein the threshold voltage of the programmable memory element is greater than about 0.5V.

3. The circuit of claim 1, wherein the off resistance of the programmable memory element is greater than about 1 G$\Omega$.

4. The circuit of claim 1, wherein the on resistance of the programmable memory element is less than about 1000 $\Omega$.

5. The circuit of claim 1, further comprising:
a first driver coupled to the first wire;
a first transistor coupled to the programmable memory element;
a second driver coupled to the second wire;
a second transistor coupled to the programmable memory element; and
an inverter coupled to the second driver.

6. The circuit of claim 1, wherein the ion conductor comprises a material selected from the group consisting of $As_xS_{1-x}$-Ag, $Ge_xSe_{1-x}$-Ag, $Ge_xS_{1-x}$-Ag, $As_xS_{1-x}$-Cu, $Ge_xSe_{1-x}$-Cu, $Ge_xS_{1-x}$-Cu, where x ranges from about 0.1 to about 0.5, $MO_x$-Ag, $MO_x$-Cu, where M is a transition metal and x is greater than or equal to 1 and less than or equal to 3.

7. The circuit of claim 6, wherein the first electrode comprises material soluble in the first ion conductor and the second electrode comprises inert material.

8. The circuit of claim 1, further comprising a second ion conductor proximate the second electrode and a third electrode proximate the second ion conductor.

9. The circuit of claim 8, wherein the programmable memory element is in a lateral configuration.

10. The circuit of claim 8, wherein the programmable memory element is in a vertical configuration.

11. The circuit claim 8, wherein the second electrode couples to a plurality of ion conductors.

12. The circuit claim 8, wherein the second ion conductor comprises a solid solution selected from the group consisting of $As_xS_{1-x}$-Ag, $Ge_xSe_{1-x}$-Ag, $Ge_xS_{1-x}$-Ag, $As_xS_{1-x}$-Cu, $Ge_xSe_{1-x}$-Cu, $Ge_xS_{1-x}$-Cu, where x ranges from about 0.1 to about 0.5, $MO_x$-Ag, $MO_x$-Cu, where M is a transition metal and x is greater than or equal to 1 and less than or equal to 3.

13. The circuit of claim 12, wherein the second ion conductor comprises Ag doped $Ge_xS_{1-x}$.

14. The circuit of claim 12, wherein second ion conductor comprises Ag doped $Ge_{0.4}S_{0.6}$.

15. A programmable logic device comprising:
a first logic cell;
a second logic cell;
a first wire coupled to the first logic cell;
a second wire coupled to the second logic cell; and
a programmable memory element coupled to the first wire and second wire, wherein the programmable element comprises a first electrode, a first ion conductor, and a second electrode, wherein the first electrode is soluble in the first ion conductor, and wherein the programmable element serves as a configurable memory element.

16. The device of claim 15, wherein the first ion conductor comprises a solid solution selected from the group consisting of $As_xS_{1-x}$-Ag, $Ge_xSe_{1-x}$-Ag, $Ge_xS_{1-x}$-Ag, $As_xS_{1-x}$-Cu, $Ge_xSe_{1-x}$-Cu, $Ge_xS_{1-x}$-Cu, where x ranges from about 0.1 to about 0.5, $MO_x$-Ag, $MO_x$-Cu, where M is a transition metal and x is greater than or equal to 1 and less than or equal to 3.

17. The device of claim 15, wherein the first ion conductor comprises Ag doped $Ge_xS_{1-x}$.

18. The device of claim 15, wherein the first ion conductor comprises Ag doped $Ge_{0.4}S_{0.6}$.

19. The device of claim 15, further comprising a second ion conductor and a third electrode proximate the ion conductor.

20. A programmable logic device comprising:
a plurality of logic cells;
a first wire coupled to a first one of the plurality of logic cells;
a second wire coupled to a second one of the plurality of logic cells;
a programmable memory element coupled to the first wire and the second wire, the programmable memory element comprising a first electrode, an ion conductor, and a second electrode, wherein at least one of the first electrode and the second electrode is soluble in the ion conductor;
a first transistor coupled between the first wire and a first end of the programmable memory element; and
a second transistor coupled between the first wire and a first end of the programmable memory element.

* * * * *